United States Patent [19]
Lupi et al.

[11] Patent Number: 5,317,219
[45] Date of Patent: * May 31, 1994

[54] COMPENSATED DIGITAL DELAY CIRCUIT

[75] Inventors: Annibale M. Lupi; Massimo G. Lupi, both of Clifton, N.J.

[73] Assignee: Data Delay Devices, Inc., Clifton, N.J.

[*] Notice: The portion of the term of this patent subsequent to Dec. 29, 2009 has been disclaimed.

[21] Appl. No.: 958,179

[22] Filed: Oct. 8, 1992

Related U.S. Application Data

[63] Continuation-in-part of Ser. No. 767,416, Sep. 30, 1991, Pat. No. 5,175,452.

[51] Int. Cl.$^5$ .......................... H03K 5/159; H03K 3/01
[52] U.S. Cl. ..................................... 307/603; 307/605; 307/606; 307/591; 328/55
[58] Field of Search ............... 307/603, 605, 606, 601, 307/491, 310, 591; 328/55

[56] References Cited

U.S. PATENT DOCUMENTS

| | | | |
|---|---|---|---|
| 4,494,021 | 1/1985 | Bell et al. | 307/606 |
| 4,899,071 | 2/1990 | Morales | 307/605 |
| 4,922,141 | 5/1990 | Lofgren et al. | 307/603 |
| 5,087,842 | 2/1992 | Pulsipher et al. | 307/597 |
| 5,159,205 | 10/1992 | Gorecki et al. | 307/605 |
| 5,175,452 | 12/1992 | Lupi et al. | 307/591 |

Primary Examiner—Timothy P. Callahan
Assistant Examiner—Toan Tran

[57] ABSTRACT

A programmable compensated digital delay circuit is described in a design format that is suited for integrated circuitry utilizing complementary MOS technology. In the integrated circuit delay, a precise single element is provided that spans a wide delay range. The element has multiple time delay cells that are selectively interconnectable to form one or more delay lines. Each time delay cell has controllable capacitive elements and current sources which, in turn, are selected by use of a nonvolatile memory. Both the capacitive elements and the current sources are arrayed in a binary weighted manner. The delay is set by using portions of the memory to select capacitive elements and current sources. With the memory functioning with other integrated circuitry, different capacitive elements and current sources are switched into and out of the circuit. The programmable compensated digital delay circuit of the invention is self-compensating for temperature and power supply variations. The compensation adjusts the operating levels and subranges of the time delay lines. A precision delay line is formed from complementary MOS technology without using a reference frequency. The precision delay line is further characterized by high pulse fidelity that is, one with substantially no pulse width distortion and by high operating frequency.

19 Claims, 5 Drawing Sheets

COMPENSATED DIGITAL DELAY CIRCUIT

CROSS-REFERENCE TO RELATED APPLICATION

The within application and the U.S. Pat. No. 5,175,452, issued Dec. 29, 1992 on Application Ser. No. 767,416, filed Sep. 30, 1991 are of common ownership and inventorship. The terminal portion of the term hereof is disclaimed so that this patent is co-terminus with the previously issued patent. Also any patent so granted is enforceable only for and during such period as the legal title to the patent is the same as the legal title to the U.S. Pat. No. 5,175,452, issued Dec. 29, 1992 on Application Ser. No. 767,416, filed Sep. 30, 1991. This terminal disclaimer runs with any patent granted hereon and is binding upon the grantor, its successors or assigns.

1. Field of the Invention

This invention relates to a compensated delay circuit, and, more particularly, to one having a design format suited for integrated circuitry utilizing CMOS technology. The delay circuit is a novel programmable digital delay circuit that employs a control signal compensated for temperature, power supply, and fabrication process variations.

2. Information Disclosure Statement

In preparing the parent application, the following patents were disclosed as being known to the inventor hereof:

U.S. Pat. No. 4,016,511—J. L. Ramsey et al. (US Air Force)

Discloses a variable delay means comprising a plurality delay sections of progressively increasing delay time and logic means for selecting the same.

U.S. Pat. No. 3,558,924—E. Lindell (General Precision Systems, Inc.)

Discloses a system employing a ramp generator and a plurality of comparators to provide different time delayed outputs.

U.S. Pat. No. 4,443,765—A. G. Findeisen et al. (US Navy)

Discloses a programmable delay line having multiple taps employing shift registers.

U.S. Pat. No. 4,482,826—S. C. Ems et al. (LeCroy Research Systems Corp.)

Discloses a programmable delay circuit employing inverter elements.

U.S. Pat. No. 4,530,107—M. Williams (Ampex Corp.)

Discloses an externally controlled delay circuit having shift registry providing fine and coarse delays.

U.S. Pat. No. 4,458,165—R. M. Jackson (Tektronix Inc.)

Discloses a programmable delay cell incorporating a delay device per se and input and output multiplexers.

U.S. Pat. No. 4,618,788—R. Backes et al. (ITT Industries, Inc.)

Discloses delay means comprising a chain of inverter pairs, the delay of each being adjustable by the same control voltage.

U.S. Pat. No. 4,626,716—Y. Miki (Sony/Tektronix Corp.)

Discloses selecting a delayed or non-delayed output from each of a chain of delay devices.

U.S. Pat. No. 4,745,310—M. C. Swapp (Motorola Inc.)

Discloses a programmable delay circuit employing a counter and comparator.

U.S. Pat. No. 4,797,586—E. O. Traa (Tektronix, Inc.)

Discloses driving a plurality of transconductance amplifiers from the inputs of a chain of buffers, varying the gains of the former and summing their outputs to get a variable delay.

U.S. Pat. No. 4,843,265—C. L. Jiang (Dallas Semiconductor Corp.)

Discloses a digital delay circuit comprising a reference clock and a plurality of arrays of delay devices controlled by a voltage derived from a comparator.

U.S. Pat. No. 4,866,314—E. O. Traa (Tektronix, Inc.)

Discloses a delay cell for a programmable delay unit where long or short delay paths may be selected.

U.S. Pat. No. 5,028,824—W. R. Young (Harris Corp.)

Discloses a programmable delay where an input pulse and control pulse are logically combined, processed and recombined with the original input.

Additionally in the course of prosecution of the parent case, the following patents were brought to the attention of the inventor and are now disclosed.

U.S. Pat. No. 4,504,749—K. Yoshida (Takeda Riken Co.)

Discloses a delay signal generating circuit with feedback loops and selective setting for the delay time of a delay unit.

U.S. Pat. No. 4,845,390—S. S. Chan (LSI Logic Corp.)

Discloses a propagation delay control in logic circuitry and circuitry for maintaining constant time delays despite processing factors and temperature and power supply voltage variations.

U.S. Pat. No. 4,878,028—Y-C. Wang et al. (Advanced Micro Devices, Inc.)

Discloses a technique for generating a precompensation delay for writing data to disks and an apparatus therefor that includes a current controlled oscillator.

U.S. Pat. No. 5,081,380—K-S. Chen (Advanced Micro Devices, Inc.)

Discloses a constant time delay circuit which is insensitive to temperature variations and has no d-c power dissipation.

U.S. Pat. No. 5,087,842—J. A. Pulsipher et al. (Digital Equipment Corp.)

Discloses a delay circuit having a plurality of delay lines, one of which is selected to operate a ring oscillator, with the reference and the multiple delay circuits formed on a single integrated circuit.

No one patent uncovered shows the delay circuit hereof or teaches toward the replacement of hybrid active delay lines and related timing circuits. The technology described hereinbelow requires no reference frequency and is self-compensating for temperature and power supply variations.

SUMMARY

The invention disclosed hereby is a programmable compensated digital delay circuit. The design format thereof is suited for integrated circuitry utilizing complementary MOS technology. In the integrated circuit delay, a precise single element is provided that spans a wide delay range. The element has multiple time delay cells that are selectively interconnectable to form one or more delay lines. Each time delay cell has controllable capacitive elements and current sources which, in turn, are selected by use of a nonvolatile memory.

In the preferred embodiment hereinbelow, both the capacitive elements and the current sources are arrayed in a weighted manner and, more particularly, in a binary weighted manner. The delay is set by using portions of the nonvolatile memory to select capacitive elements and current sources. With the nonvolatile memory portions functioning cooperatively with other integrated circuitry, differently rated capacitive elements and current sources are switched into and out of the circuit.

The programmable compensated digital delay circuit of the invention is self-compensating for temperature and power supply variations. The compensation adjusts the operating levels and subranges of the time delay lines.

With the device disclosed, a precision delay line is formed from complementary MOS technology without using a reference frequency. The precision delay line is further characterized by high pulse fidelity that is, one with substantially no pulse width distortion and by high operating frequency.

OBJECT AND FEATURES OF THE INVENTION

It is an object of the present invention to provide a programmable delay circuit of an improved design.

It is a further object of the present invention to provide a precision delay element in an integrated circuit form which utilizes CMOS technology.

It is yet another object of the present invention to provide a delay circuit with a wide delay range and precise control of the leading and trailing edges.

It is still yet another object of the present invention to provide a programmable delay circuit in which weighted capacitor values can be aggregated to establish an operating subrange for the delay circuit.

It is a feature of the present invention that the timing reference is developed internally by a ring oscillator subcircuit.

It is another feature of the present invention to have a confluence of weighted capacitors and weighted current sources which, when selected by the programmable memory, develop a specific time delay without a clock reference.

It is yet another feature of the present invention to minimize pulse width distortion by using a feedback control signal to cancel switching nonlinearities.

Other objects and features of the invention will become apparent upon review of the drawings and the detailed description which follow.

BRIEF DESCRIPTION OF THE DRAWINGS

In the following drawings, the same parts in the various views are afforded the same reference designators.

DESCRIPTION OF THE PREFERRED EMBODIMENT

By way of introduction and in general terms, a delay line output replicates the signal present at its input shifted in time. Of the two basic types of delay lines—analog and digital—the digital delay line preserves the input signal pulse width and frequency. The disclosure at hand provides a CMOS integrated circuit which provides for the delay being set by a programmable, nonvolatile memory and which replaces hybrid active delay lines and related timing circuits. The circuitry takes advantage of the complementary architecture by using, in the preferred embodiment, complementary inverter-type circuitry to reduce pulse width distortion and to thereby provide high pulse fidelity. As also will be seen by the description which follows, the integrated circuit is self-compensating for temperature and power supply variations and provides a delay line capable of high operating frequencies without requiring a reference frequency.

In order for the circuit to have a time delay which is independent of temperature and power supply variations, the inverter-type circuitry must be independent of such variations. This implies that, for the CMOS technology described herein, both the selected capacitive elements and the selected current sources must also be independent of temperature and of power supply variations. However, it is well known that the current through such circuitry is temperature and power supply dependent. In the present invention, compensation for the temperature and power supply variations is achieved by feedback circuitry incorporating a ring oscillator. This provides appropriate changes in the control voltage applied to the delay line.

Figure 1:
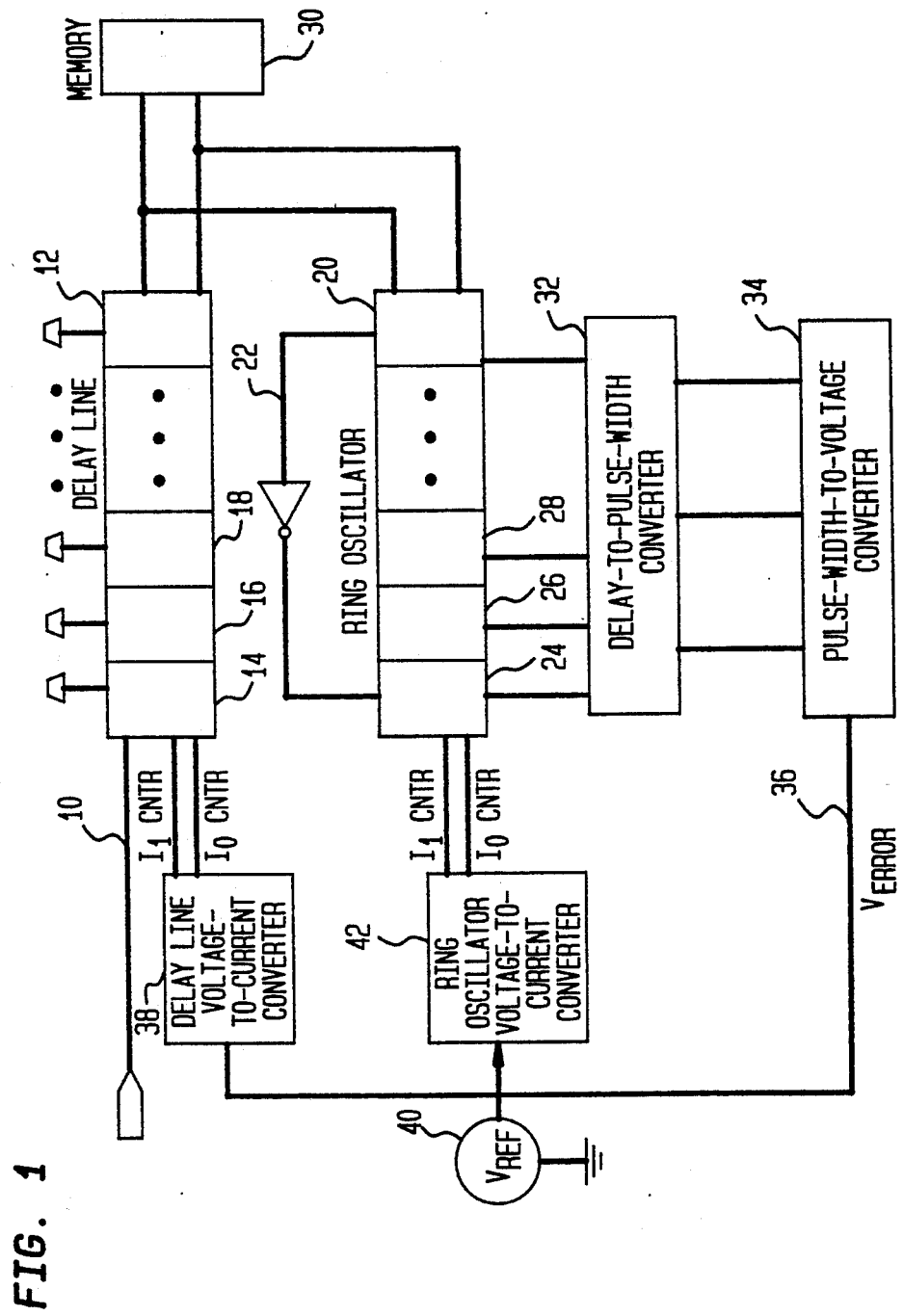
FIG. 1 is a block diagram of the programmable compensated delay circuit of the present invention.

The schematic diagram FIG. 1 shows the programmable compensated digital delay circuit of this invention, which is referred to generally by the reference designator 10. The major blocks in the circuit include a delay line 12 which, in turn, is composed of a plurality of delay cells 14, 16, and 18. A second and duplicate set of the delay cells are configured into a ring oscillator 20 which includes feedback loop 22. The oscillator cells 24, 26, and 28 correspond to the delay line cells 14, 16, and 18, respectively. While, for purposes of this example, only three cells are shown in both the delay line and the ring oscillator the number which may be constructed is only limited by the device architecture. Both the delay line 12 and the ring oscillator 20 are served by a nonvolatile memory 30, such as an E-PROM (Erasable Programmable Read Only Memory). The outputs from the ring oscillator are provided to a converter 32 which, in turn, converts the time delay thereof into pulse widths. Upon conversion to pulse-width information, the data from the converter 32 is provided to a pulse-width-to-voltage converter 34 which produces a voltage control signal 36. This signal 36 is impressed on the delay line 12 through a delay line voltage-to-current converter 38. The reference voltage 40 is impressed upon the ring oscillator 20 through a ring oscillator voltage-to-current converter 42.

Figure 2:
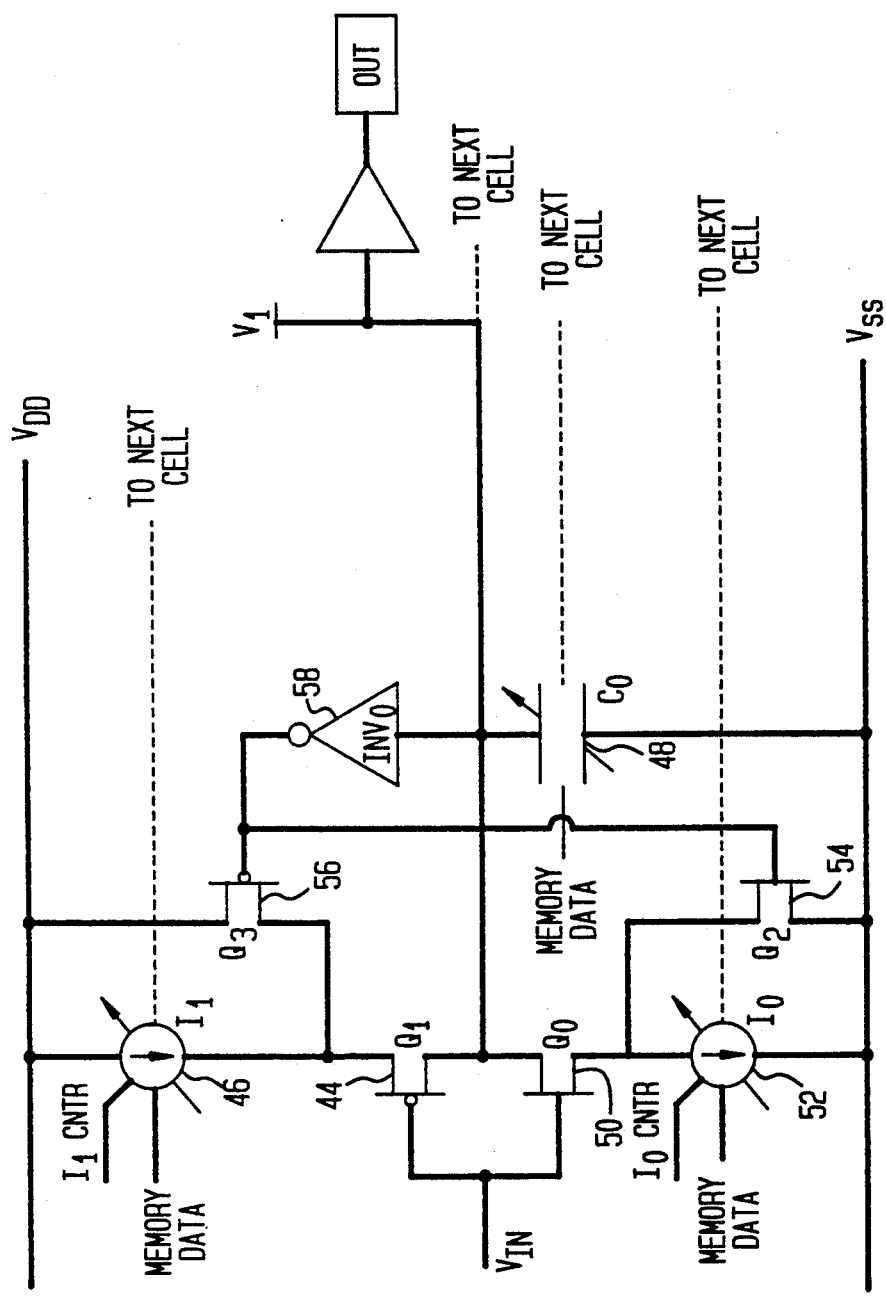
FIG. 2 is a schematic diagram of an exemplary delay cell of the delay line portion shown in FIG. 1.

Turning now to FIG. 2, the basic delay cell is illustrated in schematic form and is shown as comprising two identical, but complementary, current-sources and a capacitance-controlled delay inverters. The programmable voltage controlled current sources and capacitor network generate the desired delay as per the following equation:

$$It = CV$$

and where $V = V_{DD}/2$ is the CMOS threshold voltage, then:

$$t_{Delay} = CV_{DD}/2I$$

Transistor ($Q_1$) 44 connects current source ($I_1$) 46 to charge capacitor ($C_0$) 48 while transistor ($Q_0$) 50 connects current source ($I_0$) 52 to discharge capacitor ($C_0$) 48. Transistors($Q_2$, $Q_3$) 54 and 56, respectively and inverter ($INV_0$) 58 provide positive feedback to modified inverter string. In the best mode of practicing this invention, capacitor 48 is constructed from a series of programmable capacitive elements, preferably weighted in a binary series format with each successive element in the series having twice the capacitance of the preceeding one. Ref. this inventor's U.S. Pat. No. 5,175,452. Also, in the best mode of practicing this invention, current sources 46 and 52 are constructed from a series of programmable current sources, preferably weighted in a binary series format with each successive element in the series having twice the current of the preceeding one. The use of complementary CMOS circuitry in this manner is explained in further detail hereinbelow, especially with respect to avoiding the effect of circuit nonlinearities on transfer function timing.

Figure 3:
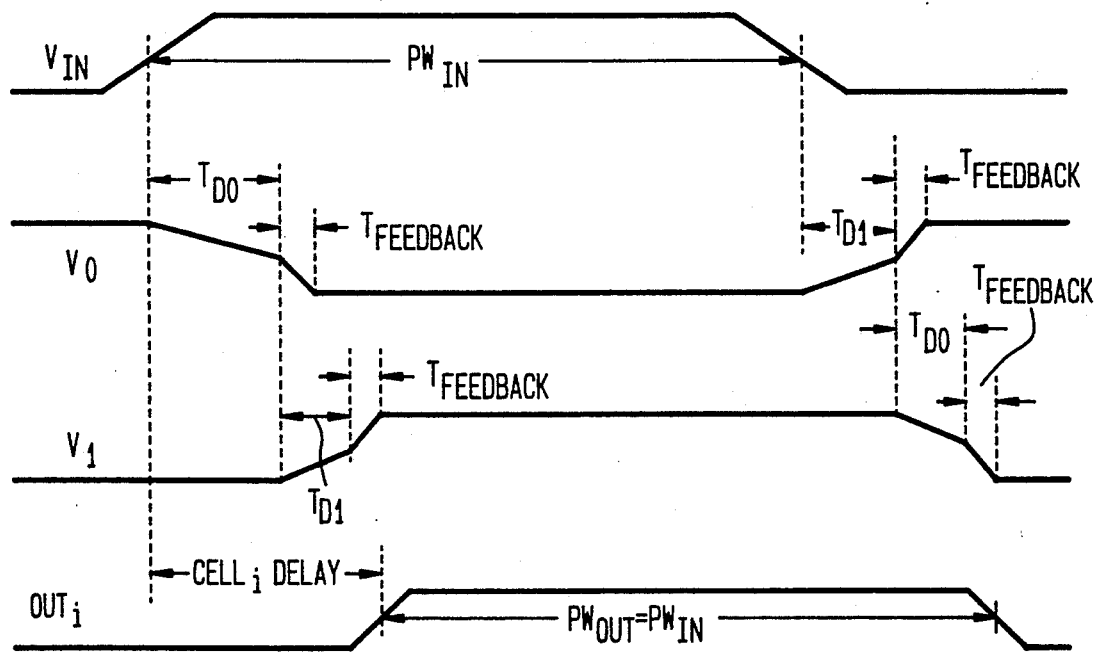
FIG. 3 is a timing diagram of the delay cell of FIG. 2.

Turning now to FIG. 3, delay line pulse width distortion is next discussed. With the present state of CMOS technology, the charging transfer function is not equal to the discharging transfer function. This results from nonlinearities introduced by the capacitors switching transistors, ON resistance, and current source voltage compliance requirements. Therefore, the modified inverter string is described by a $G_{rise}$ transfer function processing the input rising edge and by a $G_{fall}$ transfer function processing the input falling edge. This results in a distorted output pulse, that is, the input pulse width does not equal the output pulse width.

To correct for nonlinearities in $G_{rise}$ and $G_{fall}$ transfer functions, the magnitude of current source $I_{o52}$ is finely adjusted by addition of a current digital-to-analog converter which is within the voltage-to-current converter 38. This addition enables current source $I_o$ 52 to have a greater resolution than the other current source, thus allowing adjustment of the current magnitude. Then the magnitude of $I_o$ is changed so that the rise time propagates through the cell at the same rate as the fall time and nonlinearities are thus eliminated.

The delay of the cell is given by:

$$T_D = \left[ C_0 \left( 1 + \sum_{i=0}^{n-1} 2^i b_i \right) V_{DD} \right] / \left[ 2 \times I_0 \left( 1 + \sum_{j=0}^{m-1} 2^j a_j \right) \right]$$

where: $b_i = 0$ or 1; $a_j = 0$ or 1; and, where $C_0$ is the capacitance with all $b_i = 0$ and $I_0$ is the current with all $a_j = 0$.

Positive feedback, provided by transistors $Q_2$ and $Q_3$, and inverter $INV_0$ increases the cell noise immunity and enhances the operating frequency thereof.

FIG. 3 further illustrates the cell timing with the addition of positive feedback. While $V_{IN}$ is less than the switching threshold ($V_{DD}/2$), transistors $Q_0$ and $Q_3$ are ON, $Q_1$ and $Q_2$ are OFF and the voltage across capacitor $C_0$ equals $V_{DD}$. When $V_{IN}$ is greater than or equal to the threshold voltage, transistors $Q_1$ and $Q_2$ are OFF, and transistors $Q_0$ and $Q_3$ are ON, then capacitor $C_0$ is discharged by $I_0$. When the capacitor $C_0$ voltage falls below the threshold voltage, transistor $Q_3$ turns OFF while transistor $Q_2$ turns ON, thereby quickly discharging the $C_0$ capacitor. The inverse occurs when $V_{IN}$ switches from $V_{DD}$ to zero.

Therefore, the minimum period (or maximum frequency) is given by:

$$PERIOD_{(MIN)} = (T_{0\ discharge} + T_{0\ feedback} + T_{1\ charge} + T_{1\ feedback})$$

$$PW_{HIGH(MIN)} = T_{0\ discharge} + T_{0\ feedback}$$

A nonvolatile memory, organized as N by 1 bits, is used. The memory data selects the device operating mode, the delay range and the desired delay.

The monitoring circuit measures the temperature and power supply variations of the semiconductor technology dependent parameter of interest and it generates an control signal. Such signal, appropriately scaled, is added in opposition to the delay circuit control signal to compensate for temperature and power supply induced delay errors.

Figure 4:
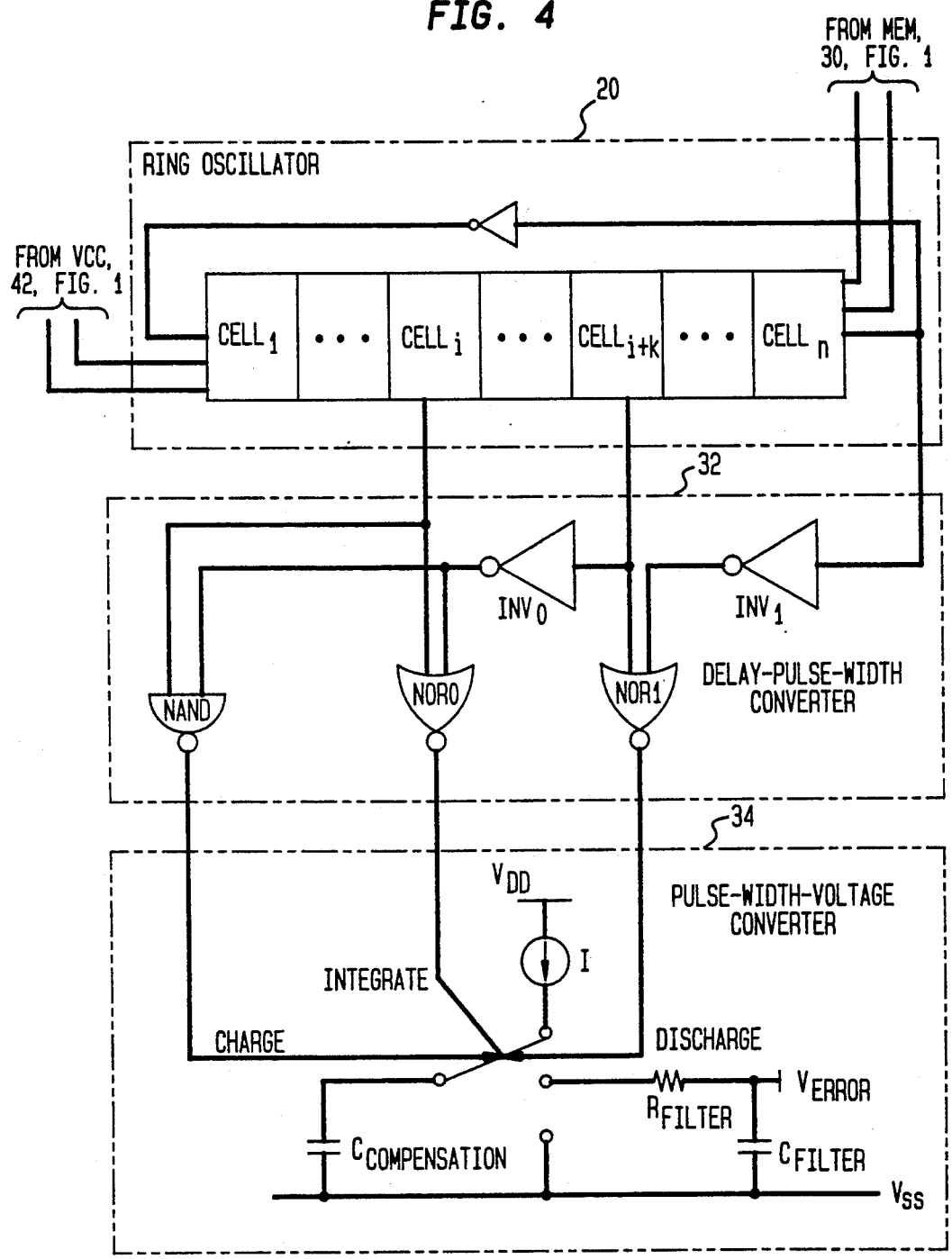
FIG. 4 is a schematic diagram of the ring oscillator and associated monitoring and compensation circuitry of invention shown in FIG. 1; and, FIG. 5 is a timing diagram of the circuitry shown in FIG. 4.
Figure 5:
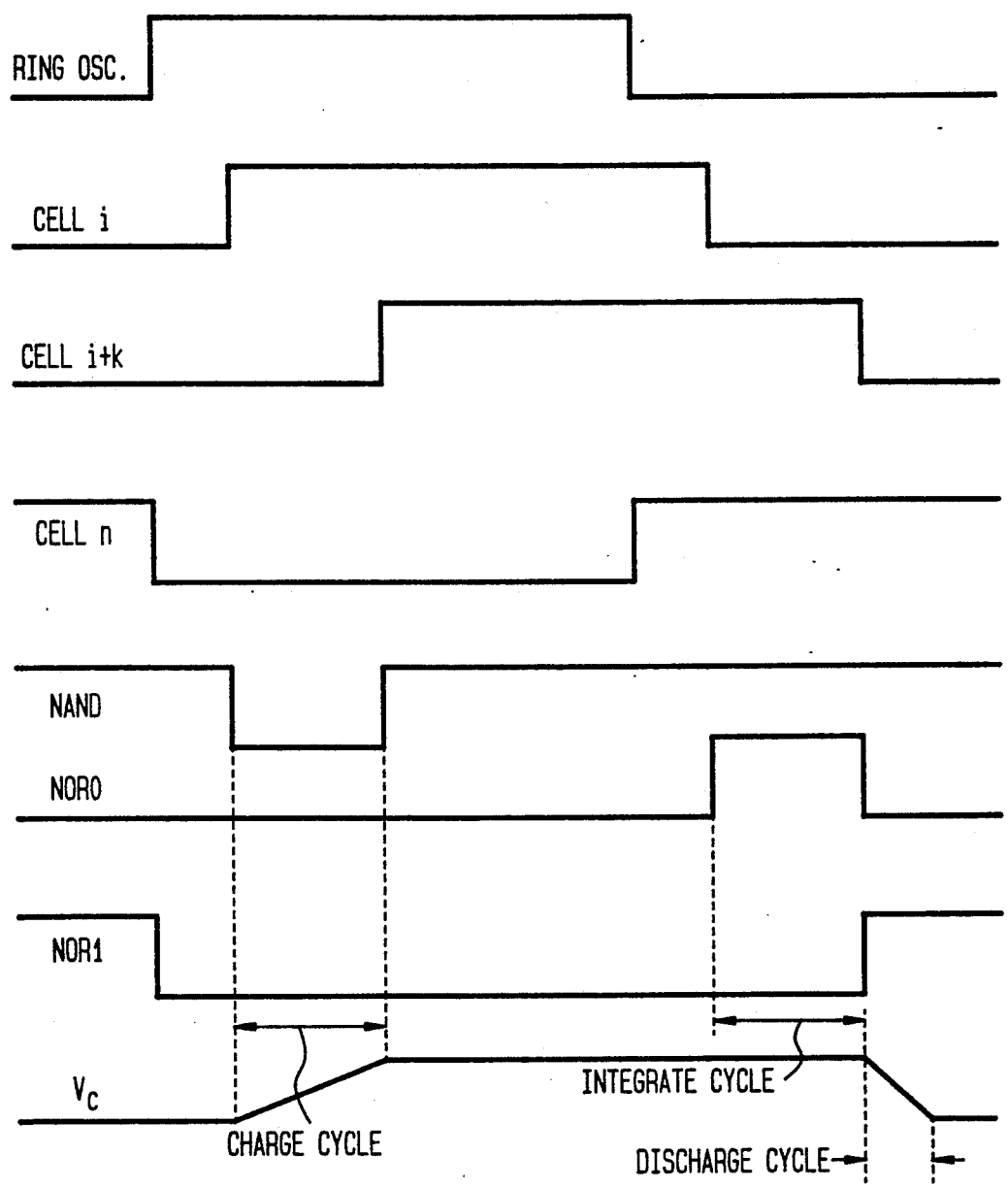

FIG. 4 illustrates schematically the details of the ring oscillator 20, FIG. 1; the delay-to-pulse width converter, 32; and, the pulse-width to-voltage converter 34. Upon a temperature variation, a power supply variation, or combination thereof disturbing the predetermined delay of the ring oscillator cell, the NAND output pulse width and the capacitor C voltage simultaneously follow the delay variations. The ring oscillator is comprised of modules which, because of identical structure to those of the delay line cells, generate a signal having a period equal to twice the number of its constituent cells times the cell set delay. The delay-to-pulse-width converter comprises logic elements $INV_0$, $INV_1$, NAND, $NOR_0$ and $NOR_1$. The output of cell $i$ and cell $i+k$ of the ring oscillator are provided to the NAND gate which generates an output with pulse width given by:

$$PW_{NAND} = (DLY_{cell\ i} - DLY_{cell\ i+k}) - DLY_{INV_0}$$

illustrated in FIG. 5 timing diagram. The NAND output connects current source I to compensation capacitor C, thus charging C for a time equal to the delay between cell $i$ and cell $i+k$. Thus a delay dependent voltage is developed according to:

$$It = CV; \text{ where, } t = PW_{NAND}, \text{ and,}$$

$$V = V_{Compensating}.$$

The $NOR_0$ output connects the capacitor C voltage to the $V_{error}$ filter for smoothing and updating compensation voltage. The output of $NOR_1$ connects the C capacitor to ground to be discharged and to be ready for the next cycle. Capacitor C voltage waveform is illustrated in FIG. 5 timing diagram.

OPERATIONAL DESCRIPTION:

The architecture accommodates a Calibration mode and a Program mode. The Calibration mode allows to set the device delay with high accuracy at a particular temperature and power supply value.

The desired delay range and delay setting data is written into the volatile memory to set the magnitude of the delay circuit control signal. The device delay is measured and, if needed, the volatile memory data is updated to minimize the delay error. Once the error is brought within acceptable limits, the data from volatile memory can be transferred to the nonvolatile memory and the device mode is updated to Program mode. The Program mode allows device operation through temperature and power supply excursion.

The initial magnitude (delay setting) of the delay circuit control signal is generated by the data permanently stored in nonvolatile memory. Temperature and power supply induced errors, detected by the relative circuits, continuously update the delay circuit control signal magnitude to maintain delay deviations within specified tolerance.

Because many varying and different embodiments may be made within the scope of the inventive concept herein taught, and because many modifications may be made in the embodiments herein detailed in accordance with the descriptive requirement of the law, it is to be understood that the details herein are to be interpreted as illustrative and not in a limiting sense.

What is claimed is:

1. A compensated digital delay circuit having a design format suited for integrated circuitry utilizing complementary MOS technology comprising:
   an input for signals-to-be-delayed;
   a delay line with a plurality of time delay cells connected to said input, each of said time delay cells selectively interconnectable for forming one or more delay configurations, said delay line having a first output therefrom;
   first circuit means for generating a variable current from a control voltage, said first circuit means connected to said time delay cells;
   internal compensation means for compensating temperature and power supply variations, said internal compensation means connected to said first circuit means to adjust the time delay of the delay cells, said internal compensation means, in turn, comprising:
      ring oscillator means for temperature and power supply compensation, said oscillator means having time delay cells selected for interchangeability with those of said delay line, said first output of said delay line connected to the ring oscillator, said ring oscillator having a second output therefrom;
      second circuit means for generating a variable current from a reference voltage, said second circuit means connected to said ring oscillator; and,
      control circuit means for generating a variable voltage signals for connection to said first circuit means to adjust the current to the time delay cells, said control circuit means connected to said second output of said ring oscillator;
   whereby a precision delay line is formed from complementary MOS technology employing an oscillator means to compensate for temperature and power supply variations and without using a reference frequency for timing.

2. A compensated digital delay circuit as described in claim 1 wherein each of said time delay cells means further comprises:
   a plurality of selectable capacitive elements arrayed therewithin in a weighted manner; and,
   a plurality of selectable current sources arrayed therewithin in a weighted manner.

3. A compensated digital delay circuit as described in claim 2 further comprising:
   first memory means for selecting one or more of said plurality of capacitive elements, said memory means being programmable to function cooperatively with said delay cell and interconnected therewith to switch differently rated capacitive elements into and out of said circuit;
   second memory means for selecting one or more of said plurality of current sources, said memory means being programmable to function cooperatively with said time delay and interconnected therewith to switch differently rated current sources into and out of said circuit; and, wherein:
   said ring oscillator means has identically selected capacitive elements and current sources as the corresponding delay line.

4. A compensated digital delay circuit as described in claim 3 wherein said ring oscillator means for temperature and power supply compensation further includes identically selectable capacitive elements and current sources as the corresponding delay lines.

5. A compensated digital delay circuit as described in claim 4 wherein said control circuit means includes a delay-to-voltage circuit means for converting the delay line time of said oscillator to a voltage control signal.

6. A compensated digital delay circuit as described in claim 5 wherein said delay-to-voltage circuit means further comprises:
   a delay-to-pulse-width converter and a pulse-width-to-voltage converter; and,
   a pulse-width distortion compensation means for compensating the delay line for switching nonlinearities, said pulse-width compensation means proportionally increasing and decreasing one of said delay cell complementary current source magnitude so as to thereby cancel transfer function deviations.

7. A compensated digital delay circuit as described in claim 2 wherein said capacitive elements are weighted in a binary series format with each successive capacitive element in the series having twice the capacitance of the preceeding one.

8. A compensated digital delay circuit as described in claim 7 wherein said selection of said capacitive elements enables the selection of a time delay subrange that encompasses deviations arising from process variations.

9. A compensated digital delay circuit as described in claim 2 wherein said current sources are weighted in a binary series format with each successive current source in the series having twice the rating of the preceeding one.

10. A compensated digital delay circuit as described in claim 9 wherein said selection of said current sources enables the selection of a precise time delay that, with the capacitive element selection, is in the sub-nanosecond range.

11. A compensated digital delay circuit having a design format suited for integrated circuitry with components deposited thereon by complementary MOS technology comprising:
   a first input for signals-to-be-delayed;
   a delay line connected to said first input with a plurality of time delay cells selectively interconnectable, for forming one or more delay lines, each of said time delay cell having a first plurality of controllably selectable circuit components, including capacitive elements and current sources, said delay line having a first memory input means for programmably selecting circuit components;
   first circuit means for generating a variable current from a control voltage, said first circuit means connected to said time delay cells;
   ring oscillator means for temperature and power supply compensation, said oscillator means formed from a second plurality of time delay cells selected for interchangeability with said plurality of time delay cells, each oscillator means having identically selected capacitive elements and current sources as the corresponding delay line, said ring oscillator having a second memory input means for programmably selecting circuit components;
   a non-volatile memory for selecting one or more said components within said integrated circuitry, said memory operative to switch said components into and out of the programmable compensated digital delay circuit, said non-volatile memory connected to said first memory input means of said delay line and to said second memory input means of said ring oscillator;
   a second input for receiving said reference voltage, said second input connected to said ring oscillator; and,
   error voltage circuit means for generating an error voltage signal, said error voltage circuit means connected to said first circuit means for adjustment of the control voltage to the programmable compensated digital delay circuit;
   whereby a precision delay line is formed from complementary MOS technology without using a reference frequency for timing.

12. A compensated digital delay circuit as described in claim 11 wherein said first plurality of time delay cells further comprises:
   a plurality of controllable capacitive elements arrayed therewithin in a weighted manner; and,
   a plurality of controllable current sources arrayed therewithin in a weighted manner.

13. A compensated digital delay circuit as described in claim 11 wherein said non-volatile memory further comprises:
   first memory means for selecting one or more of said plurality of capacitive elements, said memory means being programmable to function cooperatively with said delay cell and to switch differently rated capacitive elements into and out of said circuit;
   second memory means for selecting one or more of said plurality of current sources, said memory means being programmable to function cooperatively with said delay cell and to switch differently rated current sources into and out of said circuit.

14. A programmable compensated digital delay circuit as described in claim 19 wherein said delay-to-voltage circuit means further comprises a delay-to-pulse-width converter and pulse-width-to-voltage converter.

15. A compensated digital delay circuit as described in claim 14 wherein said capacitive elements are weighted in a binary series format with each successive capacitive element in the series having twice the capacitance of the preceeding one.

16. A digital delay circuit as described in claim 15 wherein said selection of said capacitive elements enables the selection of a time delay subrange that encompasses deviations arising from process variations.

17. A compensated digital delay circuit as described in claim 11 further includes:
   a pulse-width distortion compensation means for compensating the delay line for switching nonlinearities, said pulse-width compensation means proportionally increasing and decreasing an output of said controllably selectable current source of said delay cell to thereby cancel transfer function deviations.

18. A compensated digital delay circuit as described in claim 11 further comprising:
   second circuit means for generating a variable current from a reference voltage, said second circuit means connected to said ring oscillator; and,
   control circuit means for generating a variable voltage signal for connection to said first circuit means to adjust the current to the time delay cells, said control circuit means connected to said second output of said ring oscillator.

19. A compensated digital delay circuit as described in claim 18 wherein said control circuit means further comprises:
   a delay-to-voltage circuit means for converting the delay line time of said oscillator to a voltage control signal.

* * * * *